(12) United States Patent
Arima

(10) Patent No.: US 7,098,951 B2
(45) Date of Patent: Aug. 29, 2006

(54) IMAGE PICKUP DEVICE WITH HIGH CONTRAST DETECTION CAPABILITY

(75) Inventor: Yutaka Arima, Iizuka (JP)

(73) Assignee: Exploitation of Next Generation Co., Ltd., Fukuoka (JP)

( * ) Notice: Subject to any disclaimer, the term of this patent is extended or adjusted under 35 U.S.C. 154(b) by 724 days.

(21) Appl. No.: 10/237,736

(22) Filed: Sep. 10, 2002

(65) Prior Publication Data

US 2003/0058358 A1 Mar. 27, 2003

(30) Foreign Application Priority Data

Sep. 21, 2001 (JP) ............................. 2001-288255
Jul. 24, 2002 (JP) ............................. 2002-215040

(51) Int. Cl.
*H04N 3/14* (2006.01)
*H04N 5/335* (2006.01)

(52) U.S. Cl. ................. 348/301; 348/308; 348/310

(58) Field of Classification Search ............ 348/229.1, 348/255, 300, 301, 294, 308
See application file for complete search history.

(56) References Cited

U.S. PATENT DOCUMENTS 5,904,493 A * 5/1999 Lee et al. ..................... 438/57
5,945,722 A * 8/1999 Tsuei et al. ................. 257/440
6,097,022 A * 8/2000 Merrill et al. ............ 250/208.1
6,674,470 B1 * 1/2004 Tanaka et al. .............. 348/302
6,756,576 B1 * 6/2004 McElroy et al. ......... 250/208.1
6,757,018 B1 * 6/2004 Fowler ....................... 348/301
2003/0206234 A1 * 11/2003 Sakurai et al. ............. 348/301

FOREIGN PATENT DOCUMENTS

JP 2000-340779 12/2000
JP 2000340779 A * 12/2000

* cited by examiner

*Primary Examiner*—Ngoc-Yen Vu
*Assistant Examiner*—Richard M. Bemben
(74) *Attorney, Agent, or Firm*—Finnegan, Henderson, Farabow, Garrett & Dunner, L.L.P.

(57) ABSTRACT

Each pixel includes first and second photodiodes that are receiving-light detecting elements. The first photodiode applies a first potential according to an amount of light entering into the corresponding pixel. An internal node is electrically coupled with an internal node in another pixel via a resistance component. Hence, the second photodiode applies a second potential according to an average amount of light on the periphery to the corresponding internal node. A pixel signal generating circuit reads out a multiplied result of the first and second potentials as a pixel signal. The pixel signal has an intensity corresponding to the amount of light in the pixel in accordance with a receiving-light sensitivity characteristic (signal amplification factor) that is automatically adjusted based on an average amount of light in a region on the periphery of the pixel.

17 Claims, 16 Drawing Sheets

IMAGE PICKUP DEVICE WITH HIGH CONTRAST DETECTION CAPABILITY

BACKGROUND OF THE INVENTION

1. Field of the Invention

The present invention relates to an image pickup device that realizes receiving-light sensitivity characteristic that is close to the sensibility of human vision, and more particularly, to an image pickup device that can detect sufficient contrast in an entire region even if there is an area with a large difference in luminance present in a field of view. Hence, the inventive technique can be utilized in various situations for an imaging device having high visual sensibility, such as a monitoring camera for an area including outdoors, a camera that is mounted on a car and the like.

2. Description of the Background Art

Solid-state imaging devices such as CCD (Charge-Coupled Device) and CMOS (Complementary Metal-Oxide Semiconductor) imagers, i.e. semiconductor image sensors (hereinafter also referred to as "image pickup device"), have been embedded in video cameras, digital cameras, and nowadays even in a mobile phone, and have become widespread as inexpensive imaging devices with low power consumption.

The sensing capability of an image pickup device, however, is much inferior to the sensibility of human vision. Human vision can sufficiently detect contrast in brighter and darker portions even if there is a luminance distribution ranging over approximately four to five digits. This excellent capability in contrast sensing is realized by such a function that each of photoreceptive cells in retina can individually adjust its receiving-light sensitivity characteristic per cell.

By contrast, in a conventional image pickup device, all pixels had the same receiving-light sensitivity characteristic, which made it difficult to obtain sufficient contrast in both brighter and darker portions in the field of view at the same time.

FIGS. 14 and 15 are the first and second views showing examples of images shot by the conventional image pickup device.

Referring to FIGS. 14 and 15, each of these image examples shows a scene shot in a room lighted with a fluorescent in the daytime on a sunny day, containing the outside of a window. Such a scene is commonly seen in everyday life. It is clear from experience that a human eye would have no difficulty in seeing both the inside and outside of the room with sufficient contrast.

In the conventional image pickup device, however, when a receiving-light sensitivity characteristic is adjusted to allow the inside to be seen, the outside of the window becomes too bright, so that contrast in a brighter portion cannot be detected, as shown in the example shot in FIG. 14. On the contrary, when the sensitivity is so adjusted as to allow the outside to be seen with sufficient contrast, as shown in FIG. 15, the inside of the room now becomes too dark, preventing detection of contrast in a darker portion. This reveals that the conventional image sensor is much inferior to human vision in detection of sufficient contrast in the entire region when there are brighter and darker portions present at the same time in the field of view.

The low contrast sensibility is one of major problems to be solved in order to practically use the conventional image pickup device as a device for detecting visual information that substitutes for human vision.

The low contrast detecting capability of the conventional image pickup device will now be described with reference to FIG. 16.

In general, illuminance of the outdoors in the daylight is approximately several tens of thousands of lux. By contrast, illuminance in a room lighted with a fluorescent is approximately 500 lux at a portion not exposed to sunlight, and is 100 lux or lower at a darker portion. That is, as can be seen in the example of luminance distribution in FIG. 16, the example shots shown in FIGS. 14 and 15 exhibit the difference of two to three digits between the average luminance of the outside of the window and that of a dark portion in the room (the face portion).

In the example shot shown in FIG. 14, the receiving-light sensitivity characteristic of pixels is adjusted to have a sensitivity line shown in FIG. 16, such that sufficient contrast can be detected in a relatively bright region (at most 500 lux) in the room. In the conventional image pickup device, however, all pixels have the same sensitivity characteristic as described earlier. Hence, with the same sensitivity characteristic, a bright portion outside the window will be white due to saturation of the sensitivity. Moreover, in a dark portion, contrast will also be insufficient, since the amplitude is lowered to one-fifth of the whole. Thus, the conventional image pickup device cannot detect sufficient contrast even in a scene we often come across in everyday life.

SUMMARY OF THE INVENTION

An object of the present invention is to provide an image pickup device that can detect a bright portion and a dark portion with sufficient contrast, even if there is a wide range of luminance distribution in a field of view.

According to the present invention, an image pickup device includes a plurality of pixel circuits forming an image sensor, and a circuit that can adjust a signal amplification factor (gain) inherent to each pixel.

Preferably, each of the pixel circuits modulates amplification factor for reading of a detected receiving-light signal inherent to a pixel with an average of detected receiving-light signals in a neighborhood including a peripheral pixel.

More preferably, each of the pixel circuits includes an MOS transistor that can electrically modulate a gain coefficient $\beta$ by analog modulation. The MOS transistor is used for amplification for reading of a signal.

In such a structure, each of the pixel circuits has a $\beta$ control gate for modulating a gain coefficient $\beta$ of the MOS transistor, to which the average of the receiving-light signals on the periphery is input.

Preferably, it features that the average of the receiving-light signals on the periphery is supplied by a diode formed between a well and a substrate and by a connection resistance between pixels that is set in a form of the well.

More preferably, it features that a photodiode supplying the receiving-light signal of each pixel is formed in the well.

According to another configuration of the present invention, an image pickup device includes a plurality of pixels. Each of the pixels includes an image signal generating circuit generating an electronic signal according to an amount of light entering into the pixel itself, in accordance with a signal amplification factor adjusted based on an amount of light in the pixel itself and an amount of light in at least a part of pixels among other plurality of pixels arranged on a periphery of the pixel itself.

Preferably, the signal amplification factor is set in accordance with an average amount of light in the at least a part of pixels.

More preferably, the signal amplification factor in each of the plurality of pixels is set relatively higher at a region in which an average amount of light in the at least a part of pixels is small, compared to a region in which the average amount of light is large.

More preferably, each of the pixels further includes a first receiving-light detecting element to generate a first potential according to an amount of light entering into the pixel itself at a first node, and a second receiving-light detecting element to generate a second potential according to an amount of light entering into the at least a part of pixels at a second node. The image signal generating circuit generates the electric signal in accordance with a product of the first and second potentials.

More preferably, the first potential is raised as the amount of light entering into the pixel itself increases. The second potential is lowered as the amount of light entering into the at least a part of pixels increases.

More preferably, the first potential is lowered as the amount of light entering into the pixel itself increases. The second potential is raised as the amount of light entering into the at least a part of pixels increases.

More preferably, the first receiving-light detecting element has a first diode connected between a first fixed voltage and the first node, a direction from the first node toward the first fixed voltage being set as a forward direction. The second receiving-light detecting element has a second diode connected between the second node and a second fixed voltage, a direction from the second fixed voltage toward the second node being set as a forward direction. The second node in one of the at least a part of pixels is electrically coupled with another one of the at least a part of pixels via a resistance component.

More preferably, the first receiving-light detecting element has a first diode connected between a first fixed voltage and the first node, a direction from the first fixed voltage toward the first node being set as a forward direction. The second receiving-light detecting element has a second diode connected between the second node and a second fixed voltage, a direction from the second node to the second fixed voltage being set as a forward direction. The second node in one of the at least a part of pixels is electrically coupled with the second node in another one of the at least a part of pixels via a resistance component.

More preferably, the image signal generating circuit includes a field effect transistor that can modulate a gain coefficient β by analog modulation in accordance with a voltage applied to a control gate. The control gate of the field effect transistor is connected with the second node. The field effect transistor generates the electric signal by amplifying a potential of the first node based on the gain coefficient β.

More preferably, the image pickup device further includes a reset circuit to reset potentials of the first and second nodes to prescribed potentials at prescribed cycles, respectively.

More preferably, the image pickup device further includes a reset circuit to reset a potential of the first node to a prescribed potential at a prescribed cycle, and to electrically couple the second node to a fixed bias voltage via a resistance component.

More preferably, the image pickup device is formed on a substrate of a first conductivity type. The image pickup device further includes a well region of a second conductivity type opposite to the first conductivity type, formed on the substrate. The second receiving-light detecting element has a diode formed using a junction between the substrate and the well region.

More preferably, the second node corresponds to the well region.

More preferably, the image pickup device further includes a first diffusion region of the first conductivity type formed in the well region, and a second diffusion region of the second conductivity type formed in the first diffusion region. The first and second diffusion regions are provided independently for each of the pixels. The first receiving-light detecting element has a diode formed by using a junction between the first diffusion region and the second diffusion region.

A main advantage of the present invention is, therefore, that an image with a large luminance difference in the same field of view, which was difficult to be detected by the conventional image sensor, can be detected with sufficient contrast. As a result, the image pickup device (image sensor) of the present invention can be used as an excellent imaging device that is close to human perceptual capability. Hence, the image sensor is advantageous in the field of monitoring devices, cameras mounted on cars and the like that requires adaptation to severe environmental changes.

Considering that a CMOS image sensor in general has an S/N ratio of approximately 60 to 65 dB, the image pickup device (image sensor) of the present invention would likely be able to detect sufficient contrast for an entire screen up to the average luminance difference of approximately several hundred times, if the image quality of approximately 20 dB is allowed in the darkest portion on the screen.

Furthermore, the image pickup device (image sensor) of the present invention allows compact mounting of a function of modulating a receiving-light sensitivity characteristic by analog modulation per pixel. Thus, sensitivity and resolution no less than those of the conventional image sensor can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
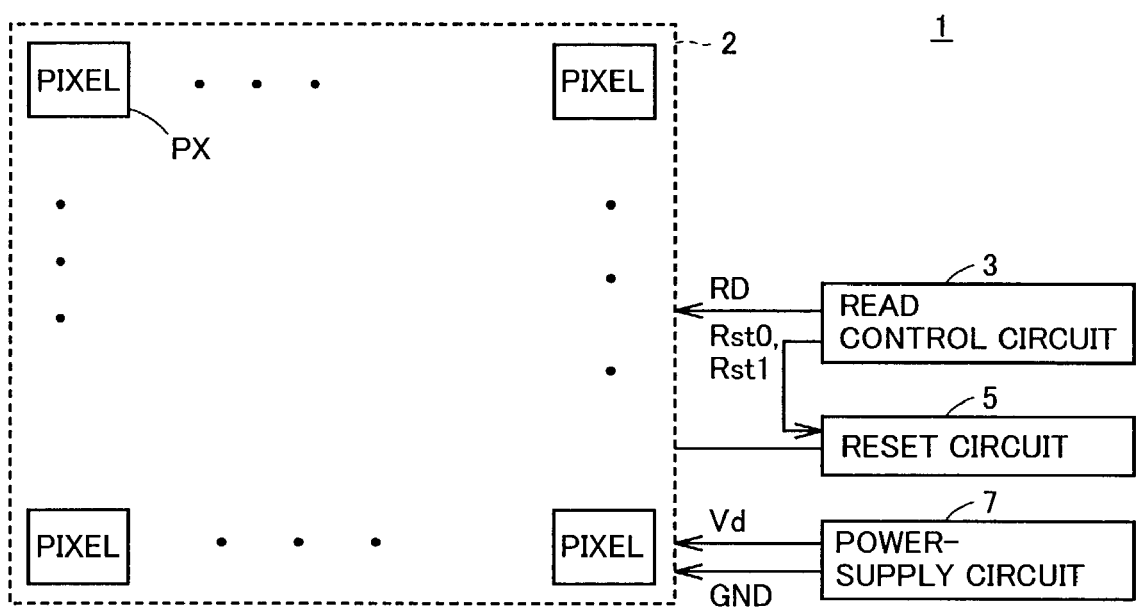
FIG. 1 is a schematic block diagram showing a configuration of an image pickup device according to an embodiment of the present invention.

Embodiments of the present invention will be described below in detail with reference to the drawings. It is noted that, in the description below, the same or corresponding portions will be denoted by the same reference characters.

First Embodiment

Referring to FIG. 1, an image pickup device 1 according to the present invention includes a pixel array 2 in which a plurality of pixels PX are arranged in a matrix of rows and columns, a read control circuit 3, a reset circuit 5 and a power-supply circuit 7.

Read control circuit 3 generates a control signal RD for controlling timing of image data generation in pixel array 2. Reset circuit 5 periodically resets the state of a receiving-light detecting element in each pixel PX. The timing of resetting operation by reset circuit 5 is controlled by reset signals Rst0, Rst1 from read control circuit 3. Power-supply circuit 7 supplies a power-supply voltage Vd and a ground voltage GND to each pixel in pixel array 2.

Figure 2:
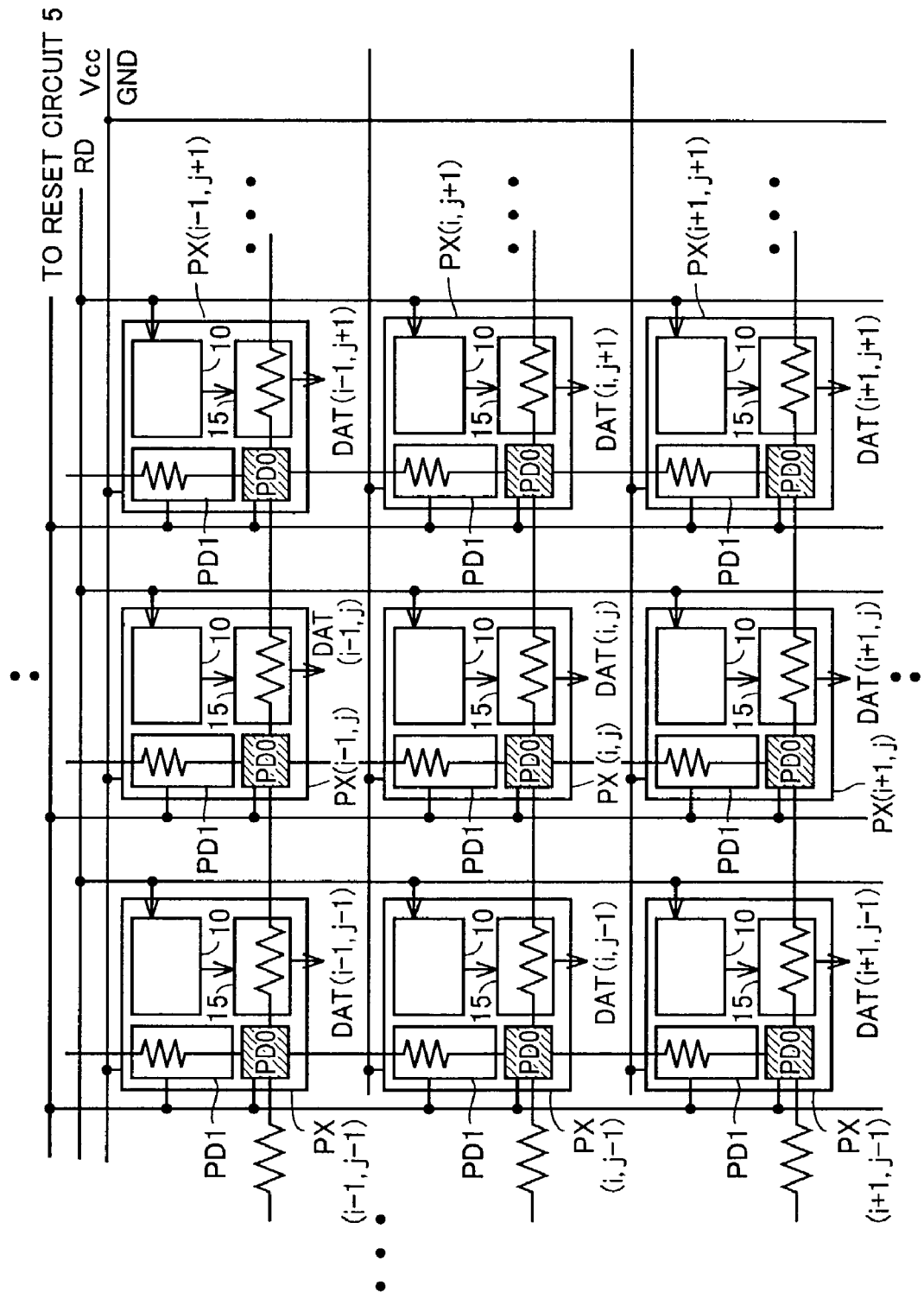
FIG. 2 is a block diagram illustrating a configuration of each pixel.

FIG. 2 is a block diagram illustrating a configuration of each pixel. In FIG. 2, pixel PX (i, j) in the i-th row and the j-th column (i, j: natural numbers) and pixels adjacent thereto are representatively shown among the plurality of pixels arranged in rows and columns.

Referring to FIG. 2, each pixel PX includes photodiodes PD0, PD1 that are receiving-light detecting elements, a pixel signal generating circuit 10 and a pixel data generating circuit 15.

Photodiode PD1 generates a signal having a potential according to an amount of light entering into a corresponding pixel. Photodiode PD0 is electrically coupled via resistance components with photodiodes PD0 within a plurality of pixels in a peripheral region. This allows photodiode PD0 in each pixel to generate a signal having a potential corresponding to an average amount of light in the region peripheral to that pixel.

In the configuration example in FIG. 2, photodiode PD0 in each pixel is electrically coupled with photodiodes PD0 in adjacent four pixels. For instance, pixel PX (i, j) is electrically coupled with pixels PX (i, j+1), PX (i, j−1), PX (i−1, j) and PX (i+1, j). The application of the present invention is, however, not limited to such a configuration, and photodiode PD0 in each pixel may also be connected with photodiodes PD0 in an arbitrary number of other pixels arranged on the periphery.

Pixel signal generating circuit 10 generates an image signal according to an amount of light entering into a corresponding pixel as an output signal, at a timing responsive to control signal RD, in accordance with respective outputs of photodiodes PD0 and PD1. The image signal has an intensity corresponding to the output of photodiode PD1, i.e. the amount of light in the pixel, in accordance with a receiving-light sensitivity characteristic (signal amplification factor) that is automatically adjusted based on the output of photodiode PD0, i.e. an average amount of light in the peripheral region of the pixel.

Thus, the receiving-light sensitivity characteristic of each pixel is automatically adjusted based on the average amount of light in the region peripheral to the pixel. Specifically, each pixel may be set to have a receiving-light sensitivity (signal amplification factor) which increases in inverse proportion to the average amount of light on the periphery. That is, each pixel has an automatic adjusting function by which its receiving-light sensitivity is set relatively high in a dark area and relatively low in a bright area.

Pixel data generating circuit 15 converts an output signal (pixel signal) from pixel signal generating circuit 10 by analog-to-digital conversion to generate image data DAT, and temporarily holds the generated image data. Image data DAT held at image data generating circuit 15 can be read from the outside the image pickup device using a scanning circuit (not shown), by each arbitrary area, i.e. by the pixel, by the row or column of pixels, or the entire pixel array at a time. It is noted that pixels that are not shown have similar internal configuration and connection between one pixel and peripheral pixels.

The configuration of each pixel will now be described in detail.

Figure 3:
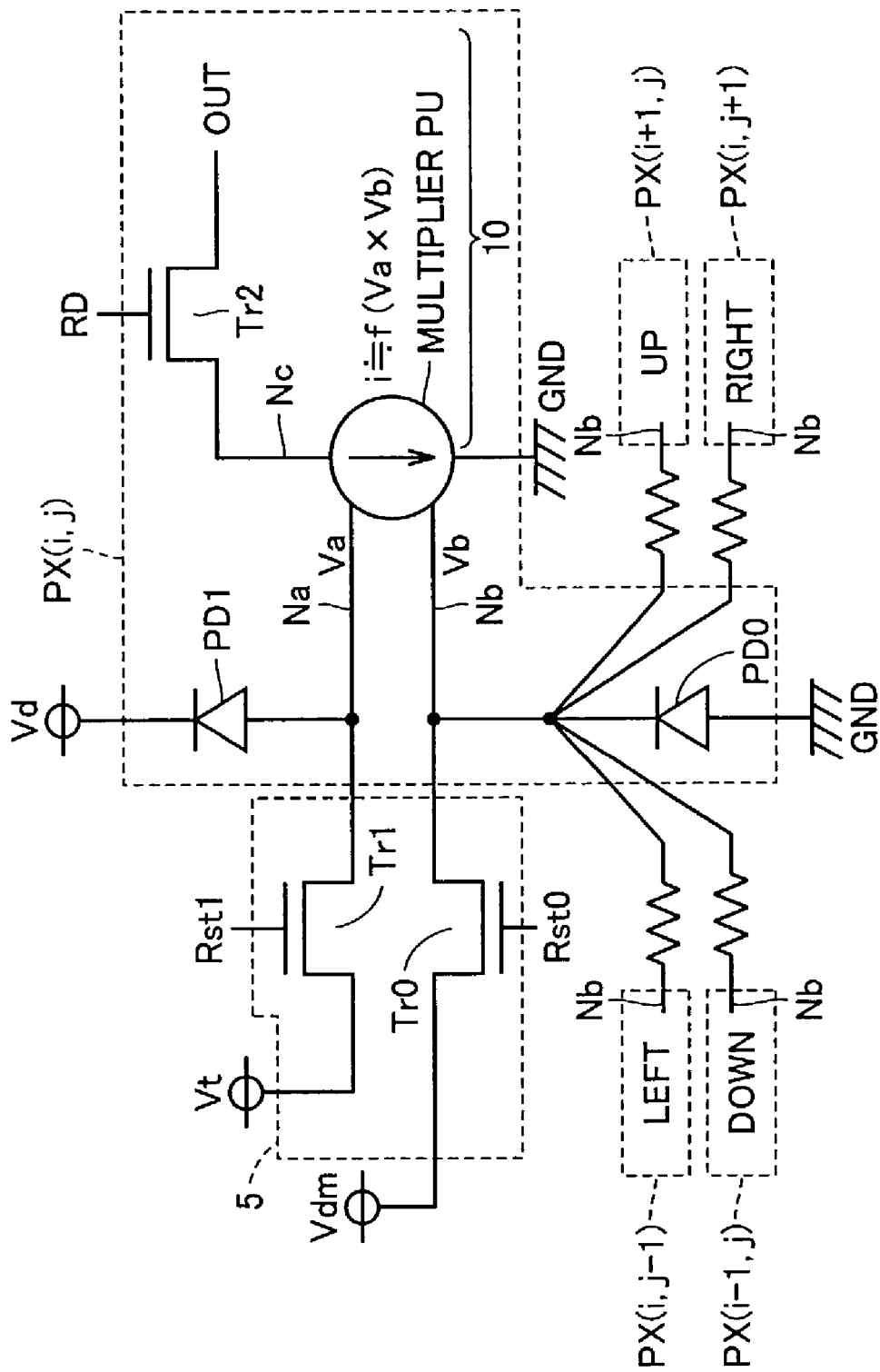
FIG. 3 is a circuit diagram showing the configuration of each pixel in detail.

Referring to FIG. 3, the circuit configuration includes a photodiode PD1 providing a potential Va corresponding to an amount of light entering into the pixel and a photodiode PD0 providing a potential Vb corresponding to an average amount of light on the periphery, and reads out a value obtained by multiplying potentials Va and Vb provided by respective photodiodes as a pixel signal.

Photodiode PD1 is connected between a node Na and power-supply voltage Vd, a direction from node Na toward power-supply voltage Vd being set as its forward direction. Photodiode PD0 is connected between a node Nb and ground voltage GND, a direction from ground voltage GND toward node Nb being set as its forward direction.

Reset circuit 5 includes a reset transistor Tr1 connected between node Na and a reset voltage Vt, and a reset transistor Tr0 connected between node Nb and a reset voltage Vdm. Reset transistors Tr0 and Tr1 are turned on in response to reset signals Rst0 and Rst1, respectively.

Reset voltage Vt is to apply a prescribed inverse bias voltage to photodiode PD1 at the time of resetting, and ground voltage GND may be used therefor. Likewise, reset voltage Vdm is to apply a prescribed inverse bias voltage to photodiode PD0, and power-supply voltage Vd may be used therefor. Such bias voltages may be supplied from, for example, power-supply circuit 7 shown in FIG. 1.

Accordingly, the resetting operation by reset circuit 5 allows nodes Na and Nb to be connected to prescribed voltages (Vt, Vdm). Subsequently, in photodiode PD1, inverse current according to the amount of light in the corresponding pixel occurs, so that potential Va changes with time in accordance with the amount of light received at the pixel.

As described with reference to FIG. 2, node Nb in each pixel is electrically coupled via resistance components with nodes Nb in other pixels. For instance, in FIG. 3, node Nb in pixel PX (i, j) is electrically coupled, via resistance components, with node Nb within each of an upper (up)

pixel PX (i−1, j), a lower (down) pixel PX (i+1, j), a left-hand (left) pixel PX (i, j−1) and a right-hand (right) pixel PX (i, j+1).

The potential of node Nb, therefore, changes with time, affected by not only the inverse current occurring at photodiode PD0 within the pixel of interest, but also the inverse current occurring at photodiodes PD0 in other pixels electrically coupled thereto. By thus connecting photodiodes PD0 in adjacent pixels via resistance components, potential Vb that is inversely proportional to the amount of light on the periphery of the pixel of interest can be generated at node Nb.

Pixel signal generating circuit 10 has a multiplier PU and a read selection switch transistor Tr2. Multiplier PU generates current i, which correlates with a product of respective potentials Va and Vb of nodes Na and Nb, between node Nc and ground voltage GND. That is, the current characteristic of multiplier PU is represented by i=f (Va×Vb), where i is approximately proportional to the product of potentials Va and Vb.

Read selection switch transistor Tr2 outputs the potential of node Nc at the timing of activation of control signal RD, as an image signal OUT.

By such a configuration, the potential of node Nc is relatively high in a pixel with a small average amount of peripheral light, i.e. a pixel in a dark portion, whereas the potential of node Nc is relatively low in a pixel with a large average amount of peripheral light, i.e. a pixel in a bright portion, even if potential Va of node Na is at the same level. Thus, a signal amplification factor (gain) can be controlled per pixel such that the receiving-light sensitivity of each pixel is increased in a dark region while it is reduced in a bright region.

Figure 4:
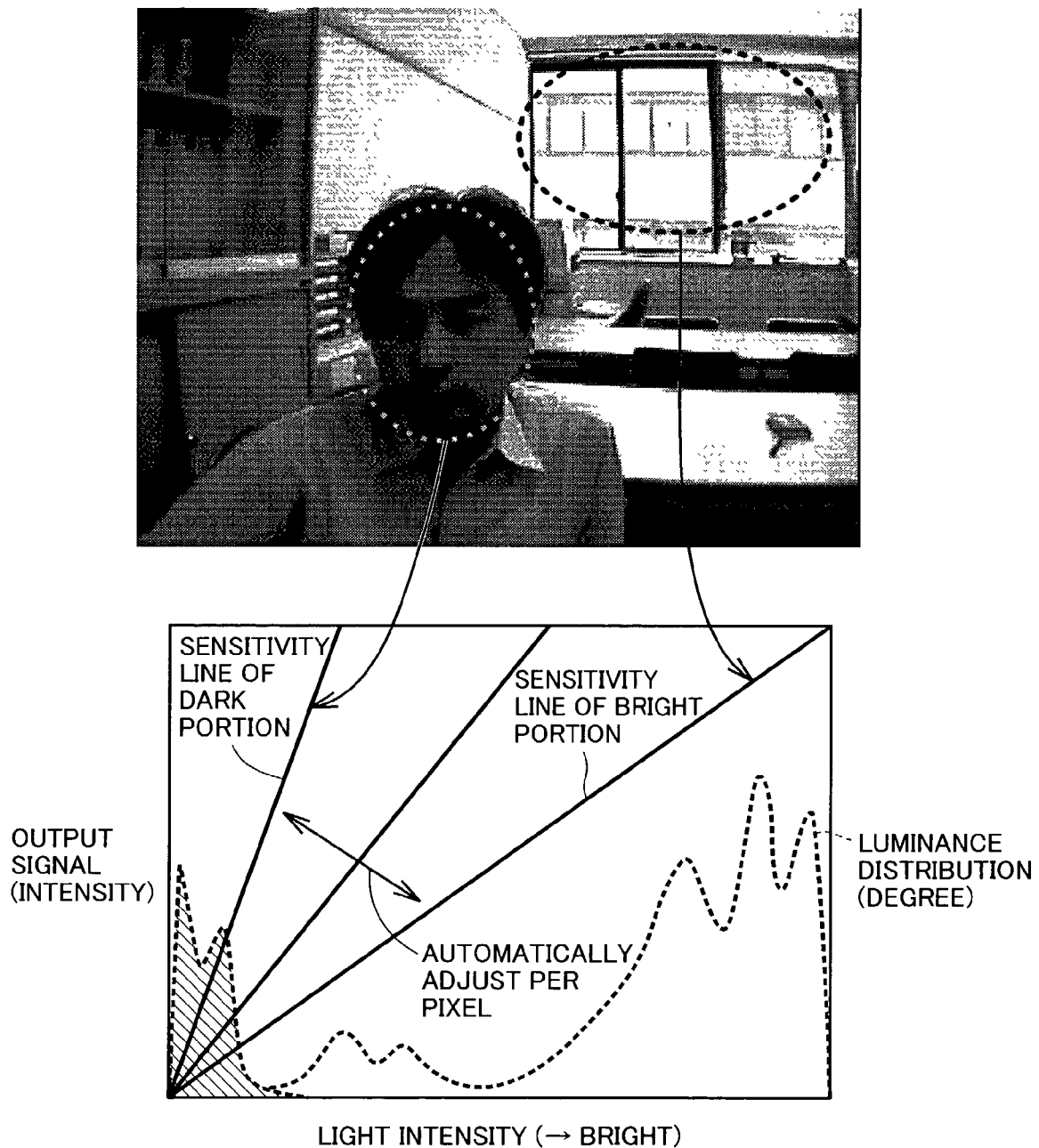
FIG. 4 schematically shows a pixel characteristic of an image pickup device according to the present invention, and an example shot thereby.

FIG. 4 schematically shows a pixel characteristic of the image pickup device according to the present invention, and an example shot thereby.

Referring to FIG. 4, in the image pickup device according to the present invention, a function of automatically adjusting a receiving-light sensitivity characteristic per pixel is provided to realize an automatic adjusting function such that a sensitivity line (signal amplification factor) for the pixel is changed in inverse proportion to the average amount of light on the periphery (the amplification factor is increased in a darker portion). Further, in the image pickup device to which such a function is mounted, if storage time (exposure time) common to all pixels is adjusted such that sufficient contrast can be maintained at the brightest portion in the field of view, signals in a dark portion is amplified in accordance with the darkness on the periphery, increasing contrast at the dark portion, and allowing detection of sufficient contrast at the entire region on a screen. The exposure time corresponds to a period from execution of the resetting operation responsive to reset signals Rst0, Rst1 until activation of control signal RD, and is set by read control circuit 3. As a result, as shown by the example shot in FIG. 4, an image pickup device that can detect both bright and dark portions with sufficient contrast can be realized.

Second Embodiment

In the second embodiment, a configuration of multiplier PU suitable for such control of the signal amplification factor will be described. In the second embodiment, an MOS transistor that can control a gain coefficient β in accordance with an input voltage to a control gate (hereinafter also referred to as "A-MOS (Adjustable β-MOS) device") is used to realize the function of automatically adjusting a receiving-light sensitivity characteristic per pixel.

Figure 5:
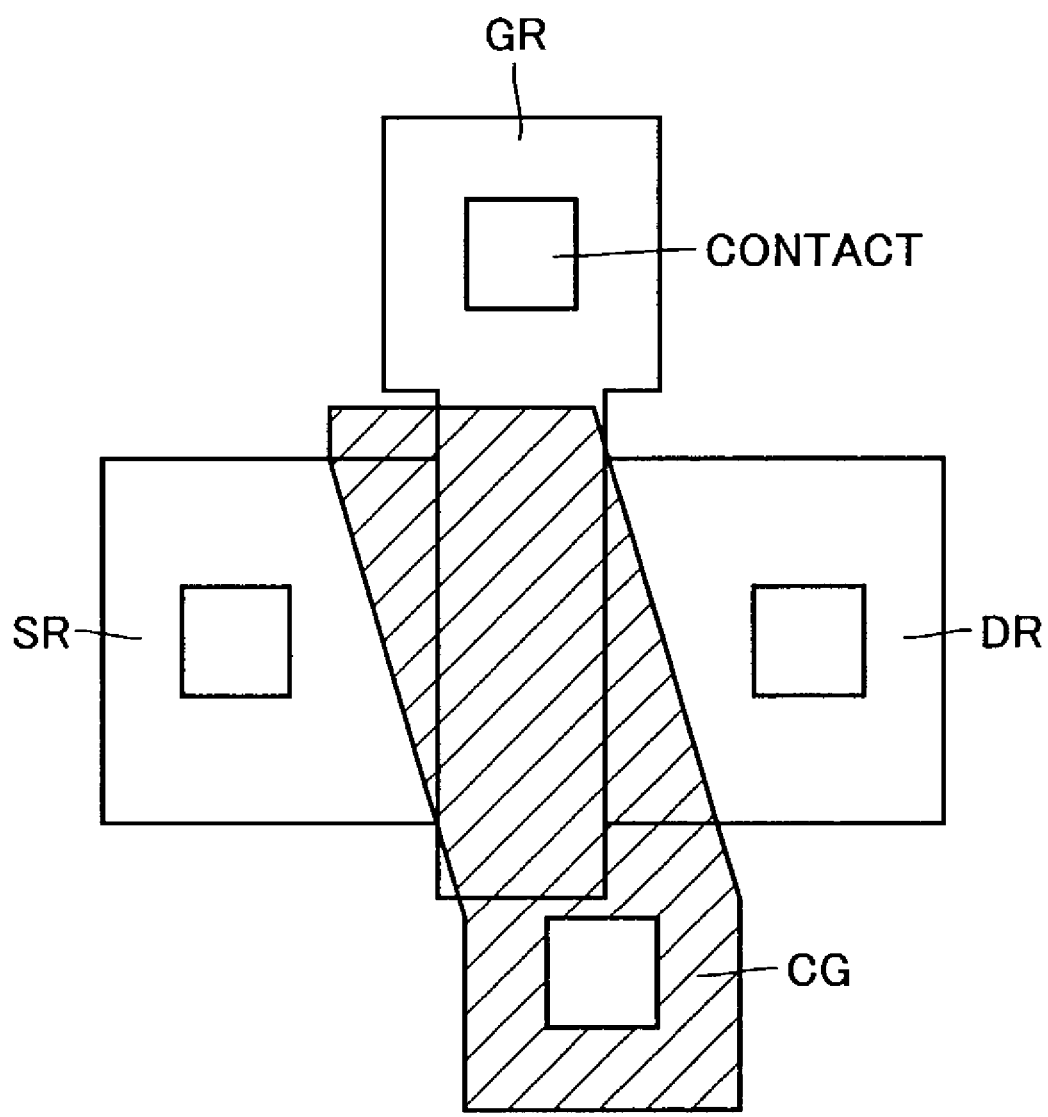
FIG. 5 schematically shows an example of a configuration of an A-MOS (Adjustable β-MOS) device.

Referring to FIG. 5, the A-MOS device includes, in addition to a normal gate GR, a source SR and a drain DR that are similar to those in a normal MOS transistor, a control gate CG formed at a certain angle with the normal gate.

Figure 6:
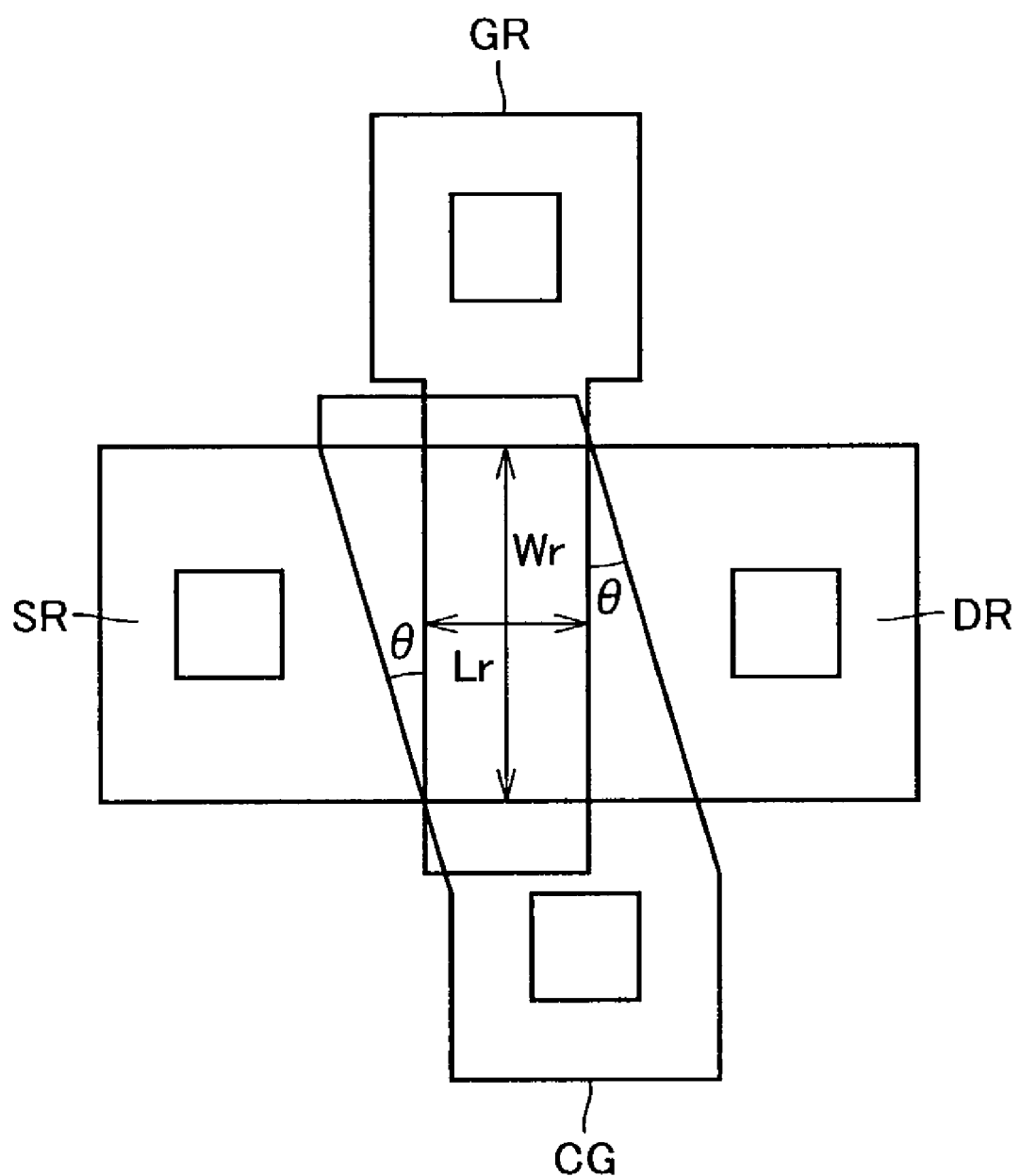
FIG. 6 schematically shows parameters in a configuration of an A-MOS device.

FIG. 6 is a schematic view showing parameters for configuration of the A-MOS device.

Referring to FIG. 6, the A-MOS device has, as configuration parameters, a gate length Lr and a gate width Wr of normal gate GR, and an angle θ formed by normal gate GR and control gate CG.

Figure 7:
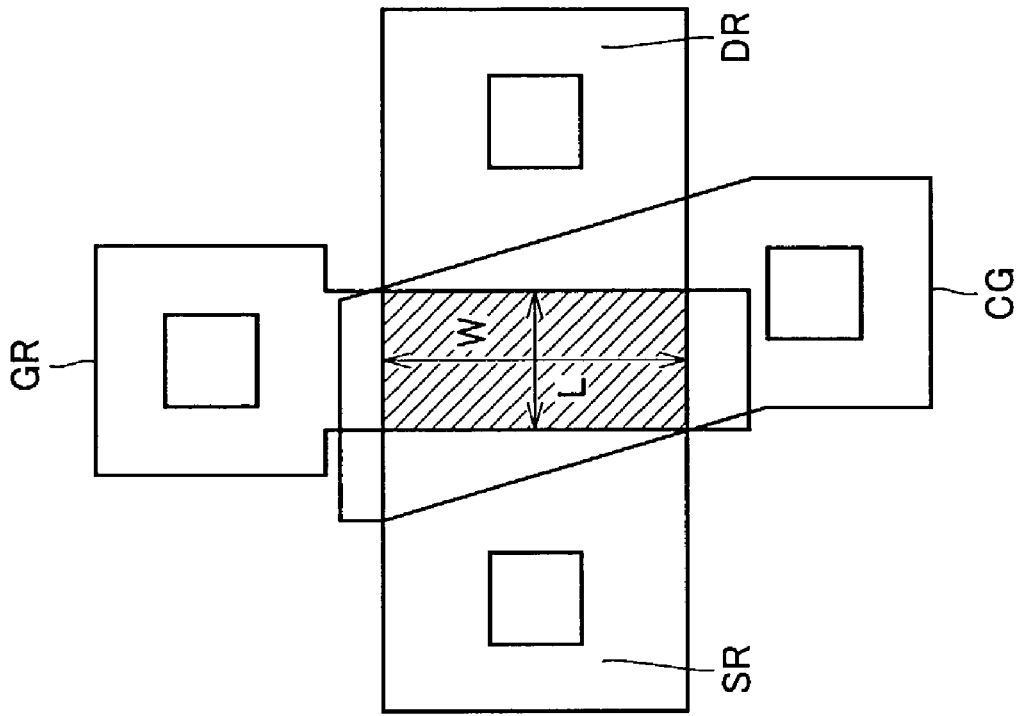
FIGS. 7A and 7B schematically illustrate a principle of β modulation in an A-MOS device.

FIGS. 7A and 7B schematically illustrate a principle of β modulation in the A-MOS device.

Referring to FIG. 7A, when an application voltage of control gate CG is set such that the conductance of the channel below control gate CG is equal to that of the normal gate, the hatched portion in the drawing is an effective gate region. That is, effective gate length L is longer than gate length Lr of normal gate GR while effective gate width W is narrower than gate width Wr of normal gate GR, resulting in a lower gain coefficient β.

Referring to FIG. 7B, when the application voltage of control gate CG is set such that the conductance of the channel below control gate CG is sufficiently higher than that of the normal gate, effective gate width W and gate length L will be equal to gate width Wr and gate length Lr of normal gate GR.

Thus, the A-MOS device can modulate effective gate length L and gate width W by analog modulation by changing the application voltage of control gate CG. As a result, the A-MOS device realizes analog modulation of gain coefficient β by a control gate voltage. Thus, the A-MOS device has a characteristic that can realize the β modulation by a factor of approximately ten to a thousand with a relatively compact form. The modulation characteristic of gain coefficient β in the A-MOS device can be set by the parameters shown in FIG. 6.

Figure 8:
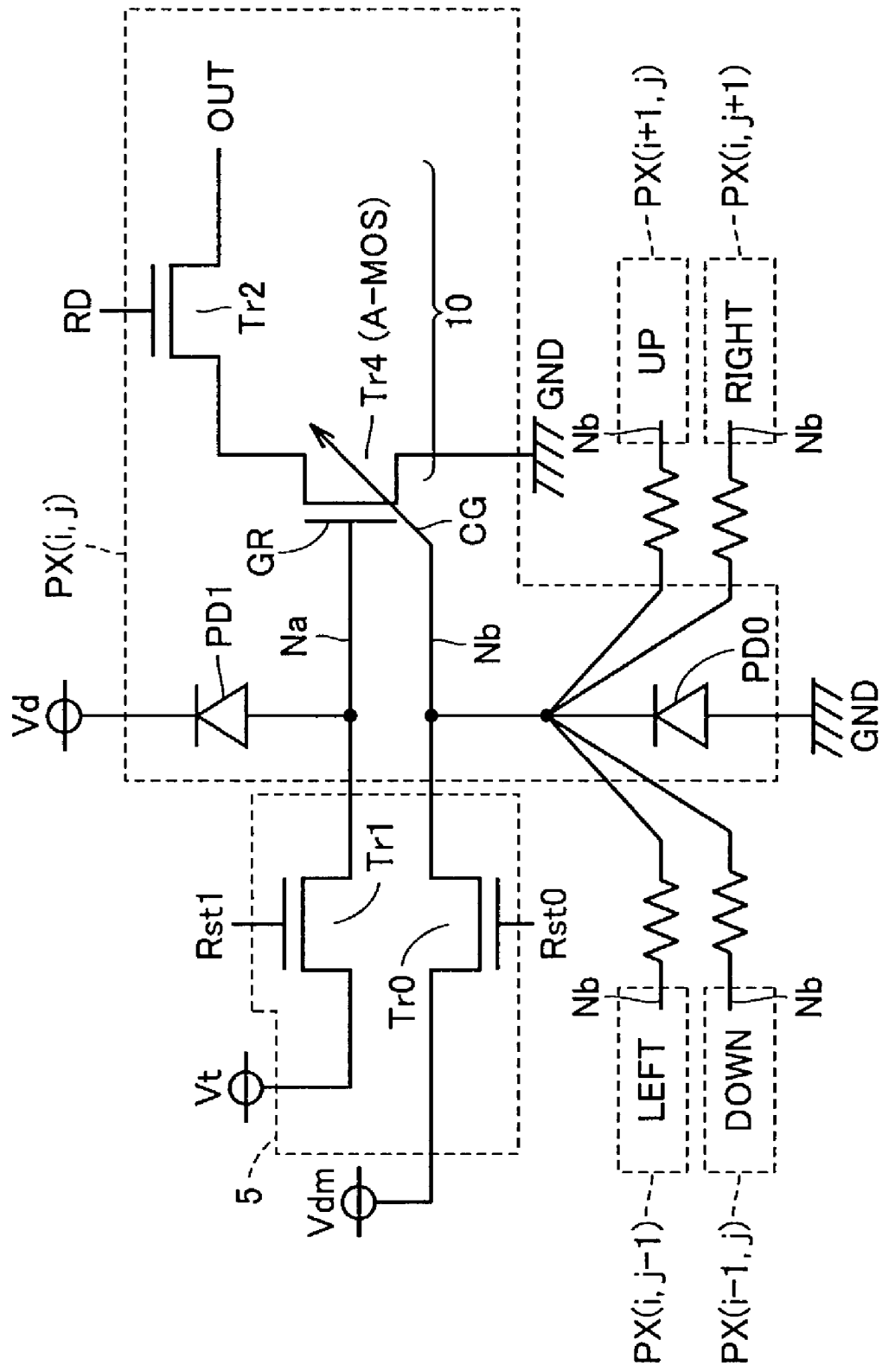
FIG. 8 is a circuit diagram showing a configuration of each pixel according to the second embodiment.

FIG. 8 is a circuit diagram showing the configuration of each pixel according to the second embodiment.

Referring to FIG. 8, in the configuration according to the second embodiment, an A-MOS transistor Tr4 electrically coupled between node Nc and ground voltage GND is provided in place of multiplier PU. Normal gate GR of A-MOS transistor Tr4 is connected to node Na, whereas control gate CG is connected to node Nb.

As such, in the second embodiment, photodiode PD1 having a potential that changes in accordance with the amount of light entering into a corresponding pixel is connected to the normal gate of A-MOS transistor Tr4, while node Nb at a potential according to the average amount of light on the periphery is connected to the control gate of A-MOS transistor Tr4. As has already been described above, the potential according to the average amount of light on the periphery is supplied by photodiode PD0 for detecting the average amount of light, which is connected to peripheral pixels via resistance components.

Such a configuration realizes control per pixel, such that gain coefficient β of the A-MOS transistor is increased in a pixel having a small average amount of light on the periphery, i.e. a pixel in a dark portion, whereas β is reduced in a pixel in a bright portion. In other words, the A-MOS transistor can realize the function of multiplier PU shown in FIG. 3.

Such control of β per pixel allows the signal amplification factor in the pixel in a dark portion to be higher than that in the pixel in a bright portion, as in the first embodiment. As a result, contrast in the dark portion can be enhanced. Reset circuit 5 and the other portions of each pixel are configured as in the first embodiment, so that description thereof will not be repeated.

By thus using the A-MOS device as a signal read amplification transistor for each pixel, a relatively simple circuit configuration in which a voltage indicating the average amount of light on the periphery is applied to the control gate of the A-MOS device can realize the automatic adjusting function that increases the amplification factor of the pixel to approximately one hundred when it is dark on the periphery, while increase of the pixel area caused by the automatic adjusting function mounted per pixel can be prevented.

Third Embodiment

In the third embodiment, effective arrangement of two photodiodes provided in each pixel will be described.

Figure 9:
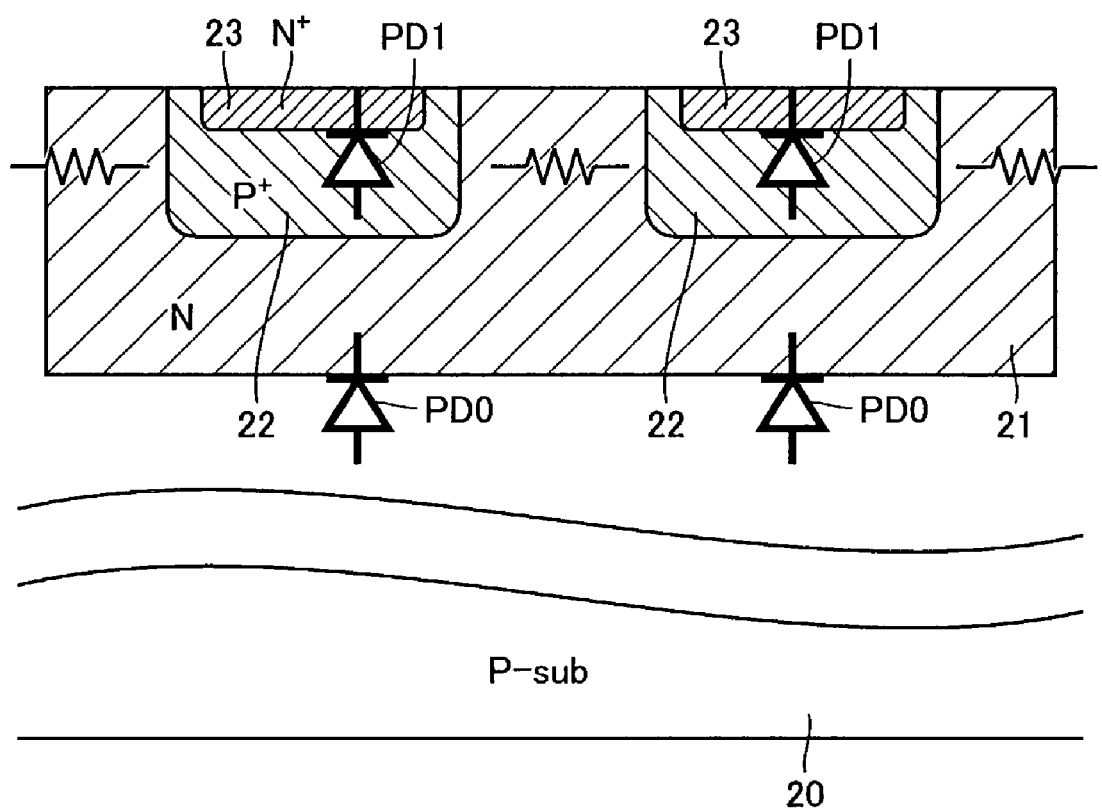
FIG. 9 is a structural view showing an arrangement example of a photodiode according to the third embodiment.

FIG. 9 is a structural view showing an arrangement example of photodiodes according to the third embodiment.

Referring to FIG. 9, a PN junction formed between a P-type silicon substrate (P-sub) 20 on which an image pickup device is formed and an N-well 21 provided on P-type silicon substrate 20 is used to form photodiode PD0 for detecting an average amount of light in a peripheral region.

Further, a PN junction formed between a $P^+$ region 22 formed within N-well 21 and $N^+$ region 23 formed within $P^+$ region 22 is used to form photodiode PD1 for detecting an amount of light entering into the corresponding pixel. It is noted that $P^+$ region 22 and $N^+$ region 23 are heavily doped compared to P-type silicon substrate 20 and N-well 21.

$P^+$ region 22 and $N^+$ region 23 are provided independently for each pixel. Further, a plurality of pixels created in the same N-well 21 are electrically coupled with one another via diffusion resistances in the N-well. That is, N-well 21 in each pixel corresponds to node Nb in the circuit configuration shown in FIG. 3. Accordingly, nodes Nb at the plurality of pixels created in the same N-well 21 is electrically coupled with one another, to detect the average amount of light.

Alternatively, the whole pixel array 2 may be formed on the same N-well. In such a case, in each pixel, the electrical resistance between photodiode PD0 in the pixel and photodiode PD0 in another pixel is raised as the distance between the pixels increases. Hence, potential Vb of node Nb in each pixel is relatively greatly affected by the amount of light entering into adjacent pixels, resulting that the average amount of light in a region peripheral to that pixel can be detected by potential Vb.

In the arrangement of photodiodes according to the third embodiment, two photodiodes provided in each pixel are arranged in a vertical structure. Moreover, the resistance connection between the photodiodes in adjacent pixels can be formed in the form of an N-well, without the need for special wiring or the like. Therefore, increase in the area of each pixel and the pixel array can be prevented.

Fourth Embodiment

Figure 10:
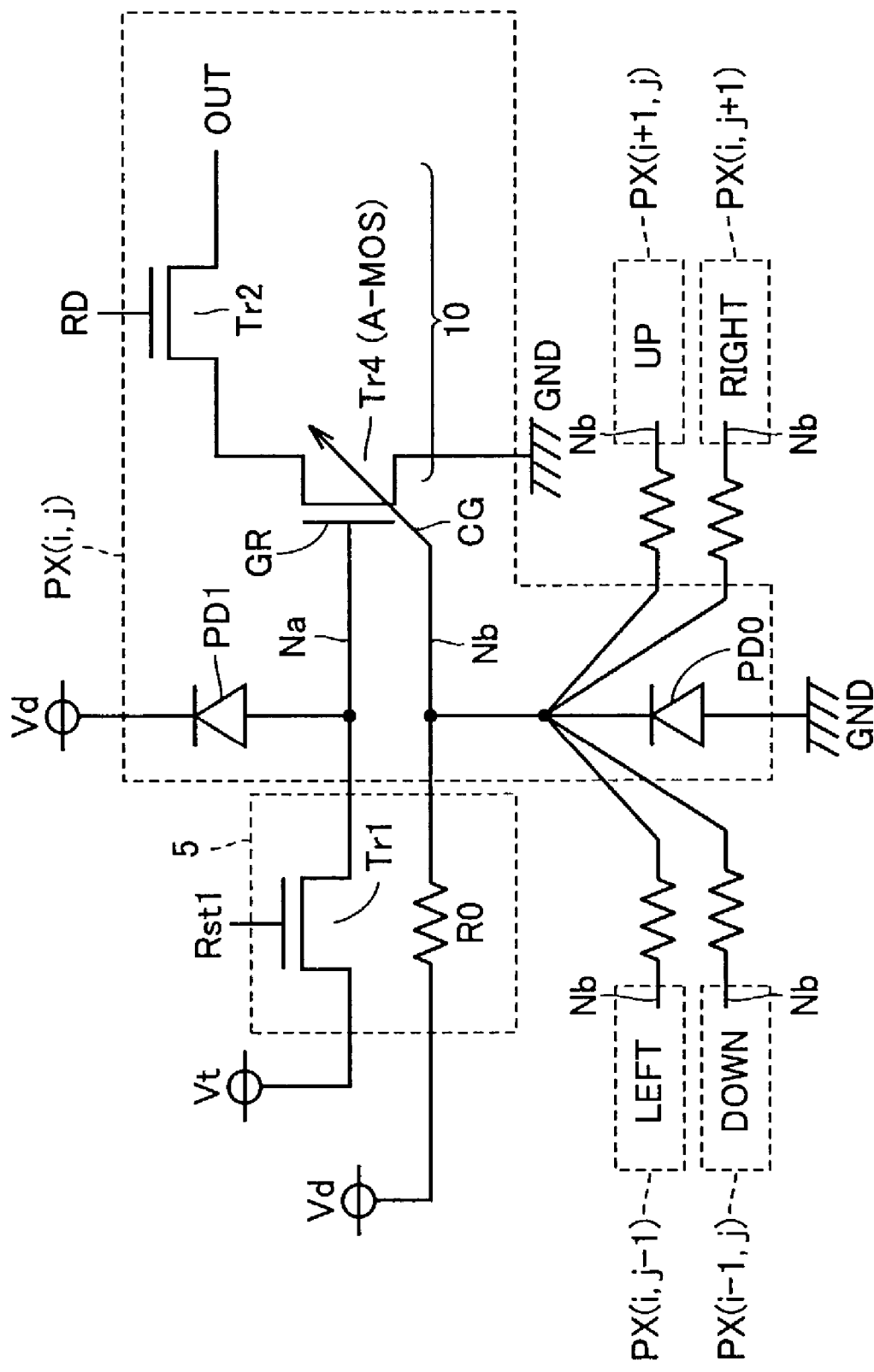
FIG. 10 is a circuit diagram showing a configuration of a pixel according to the fourth embodiment.

FIG. 10 is a circuit diagram showing the configuration of a pixel according to the fourth embodiment.

Comparing FIG. 10 with FIG. 8, in the configuration according to the fourth embodiment, a resistor R0 is connected between a reset voltage (e.g. power-supply voltage Vd) and node Nb, in place of reset transistor Tr0 provided in correspondence to photodiode PD0. The other portions are configured as those shown in FIG. 8, so that the detailed description thereof will not be repeated.

Such a configuration also allows detection of the average amount of light in the region peripheral to a corresponding pixel by potential Vb of node Nb, as in the first and second embodiments, since node Nb comes to have a potential according to the amount of light entering into photodiodes PD0 in the corresponding pixel and peripheral pixels electrically connected to the pixel. This eliminates the need for periodic resetting operation for detection of the average amount of light on the periphery, allowing simplified configuration of reset circuit 5. It is noted that a similar configuration can be applied to the circuit configuration shown in FIG. 3 according to the first embodiment.

Fifth Embodiment

Figure 11:
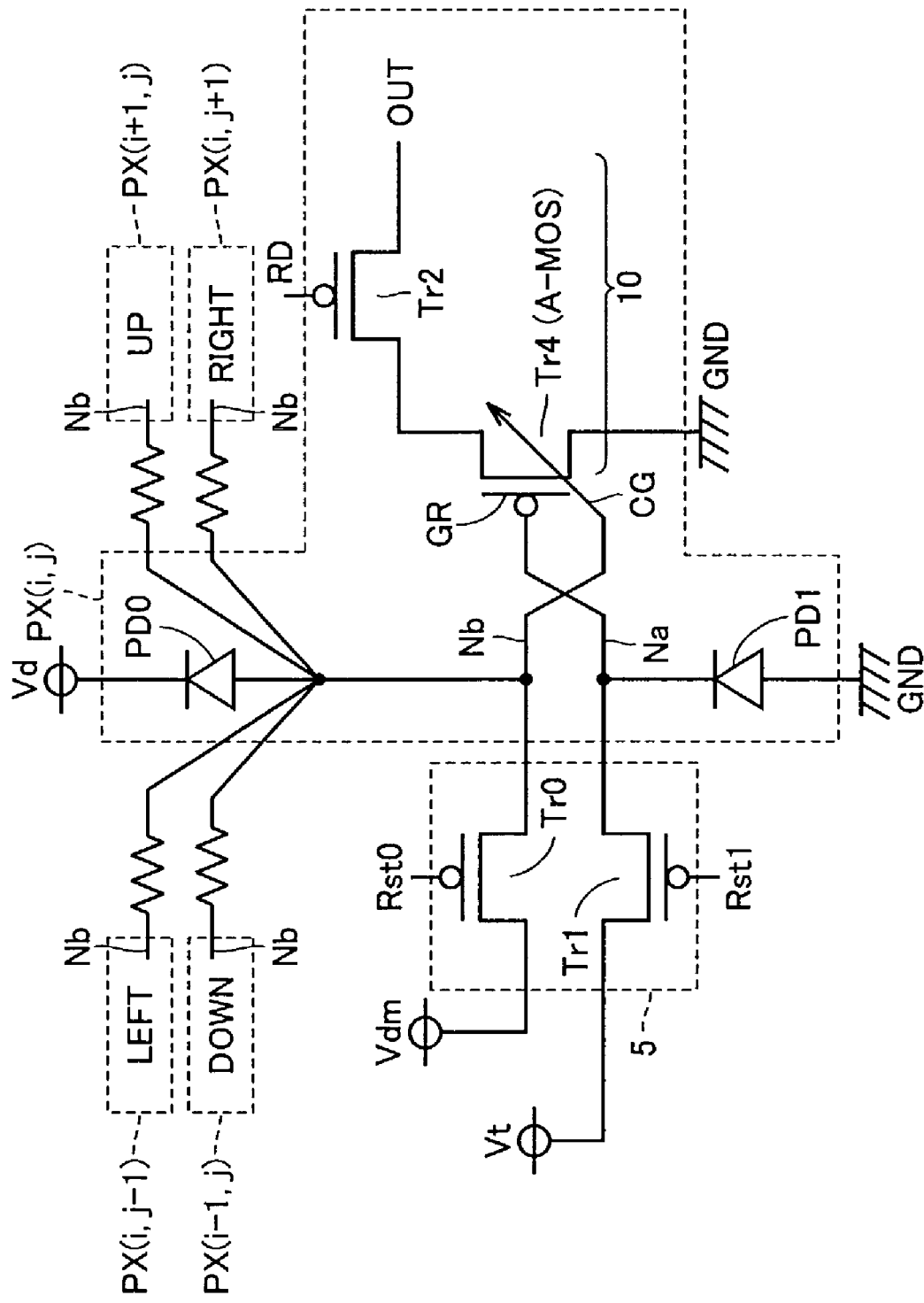
FIG. 11 is a circuit diagram showing a configuration of a pixel according to the fifth embodiment.

FIG. 11 is a circuit diagram showing the configuration of pixels according to the fifth embodiment.

Comparing FIG. 11 with FIG. 8, in the configuration according to the fifth embodiment, the photodiodes are interchanged in their positions from the configuration according to the second embodiment. That is, photodiode PD0 is connected between node Nb and power-supply voltage Vd with a direction from node Nb toward power-supply voltage Vd set as its forward direction, while photodiode PD1 is connected between ground voltage GND and node Na with a direction from ground voltage GND toward node Na set as its forward direction. Accordingly, read selection switch transistor Tr2 and A-MOS transistor Tr4 are changed from the N-channel type to P-channel type. A similar configuration may also be applied to the circuit configuration shown in FIG. 3 according to the first embodiment.

Figure 12:
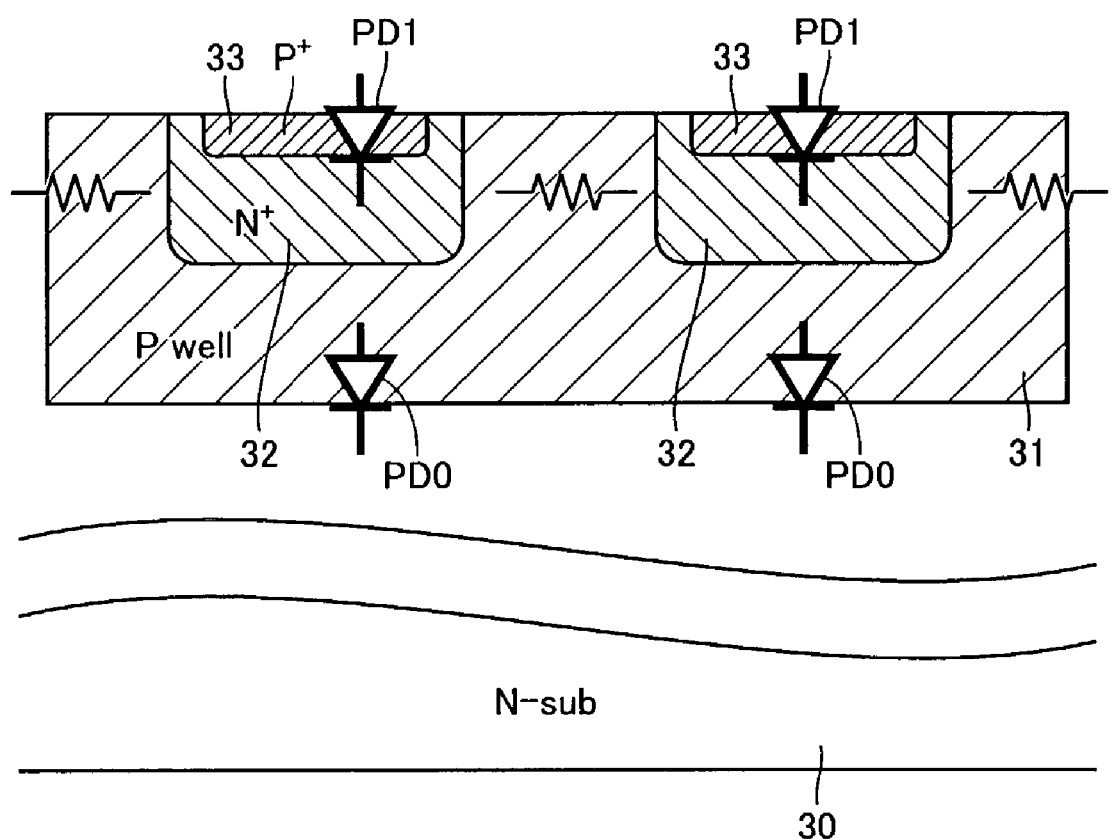
FIG. 12 is a structural view showing an arrangement example of a photodiode according to the fifth embodiment.

FIG. 12 is a structural view showing an arrangement example of the photodiodes according to the fifth embodiment.

Referring to FIG. 12, in the fifth embodiment, a PN junction formed between N-type silicon substrate (N-Sub) 30 and P-well 31 provided thereon is used to form photodiode PD0 for detecting an average amount of light in a region peripheral to the corresponding pixel. Moreover, a PN junction formed between $N^+$ region 32 formed within P-well 31 and $P^+$ region 33 formed within $N^+$ region 32 is used to form photodiode PD1 for detecting an amount of light entering into the pixel.

As in the structure shown in FIG. 9, $N^+$ region 32 and $P^+$ region 33 are provided independently for each pixel, $N^+$ region 32 and $P^+$ region 33 being heavily doped compared to N-type silicon substrate 30 and P-well 31. Further, P-well 31 may be designed in a manner similar to N-well 21 in FIG. 9.

Such a configuration in which the photodiodes are interchanged in their positions can also realize an automatic adjusting function such that a sensitivity line (amplification factor) is changed for each pixel in accordance with the average amount of light on the periphery, to detect sufficient contrast in the entire area on the screen, as in the first and second embodiments. Furthermore, as in the third embodiment, increase in the area of each pixel and pixel array can also be prevented in the configuration that requires two photodiodes for each pixel.

Sixth Embodiment

Figure 13:
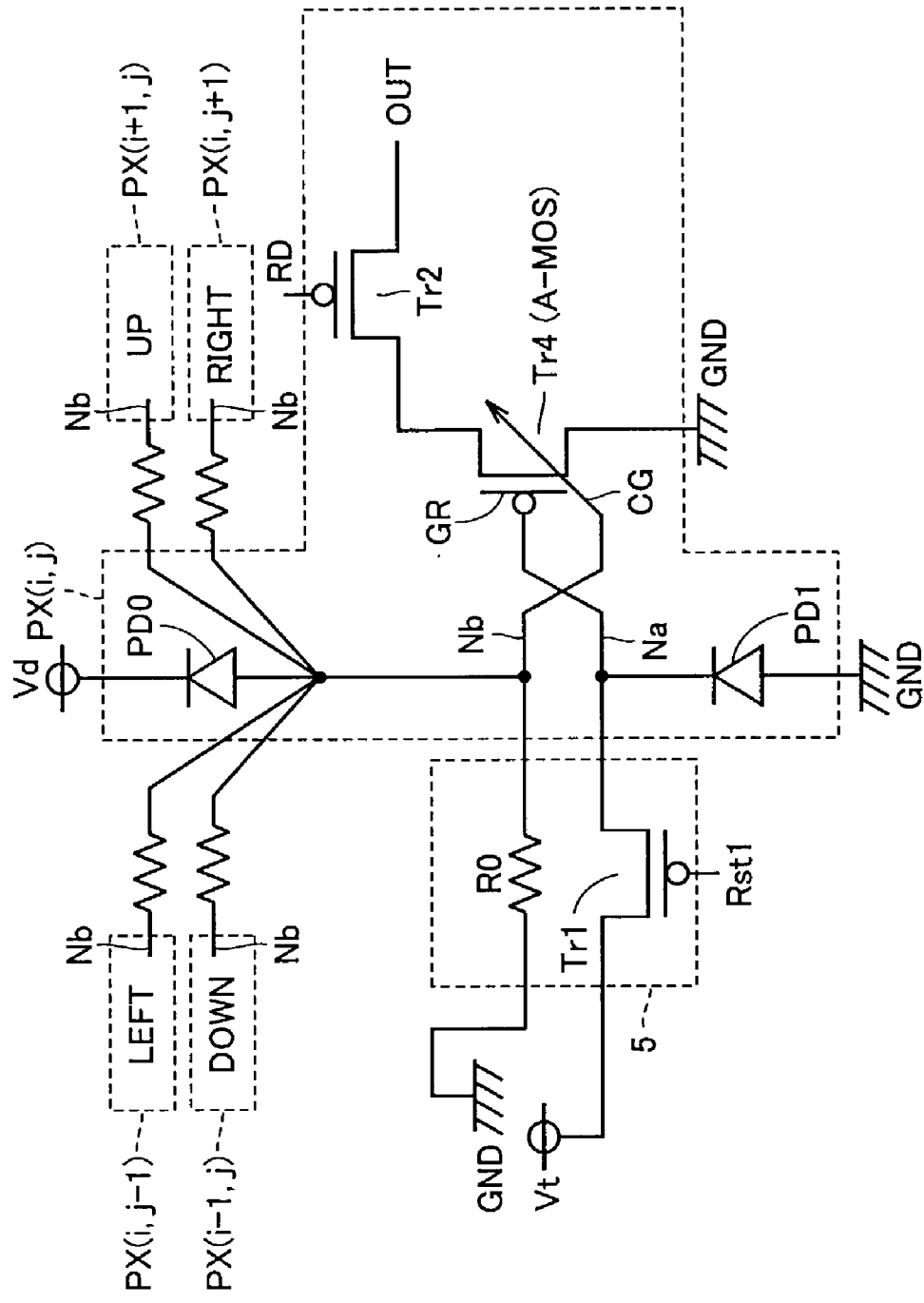
FIG. 13 is a circuit diagram showing a configuration of a pixel according to the sixth embodiment.
Figure 14:
FIG. 14 is a first view showing an example shot by a conventional image pickup device (inside visible)
Figure 15:
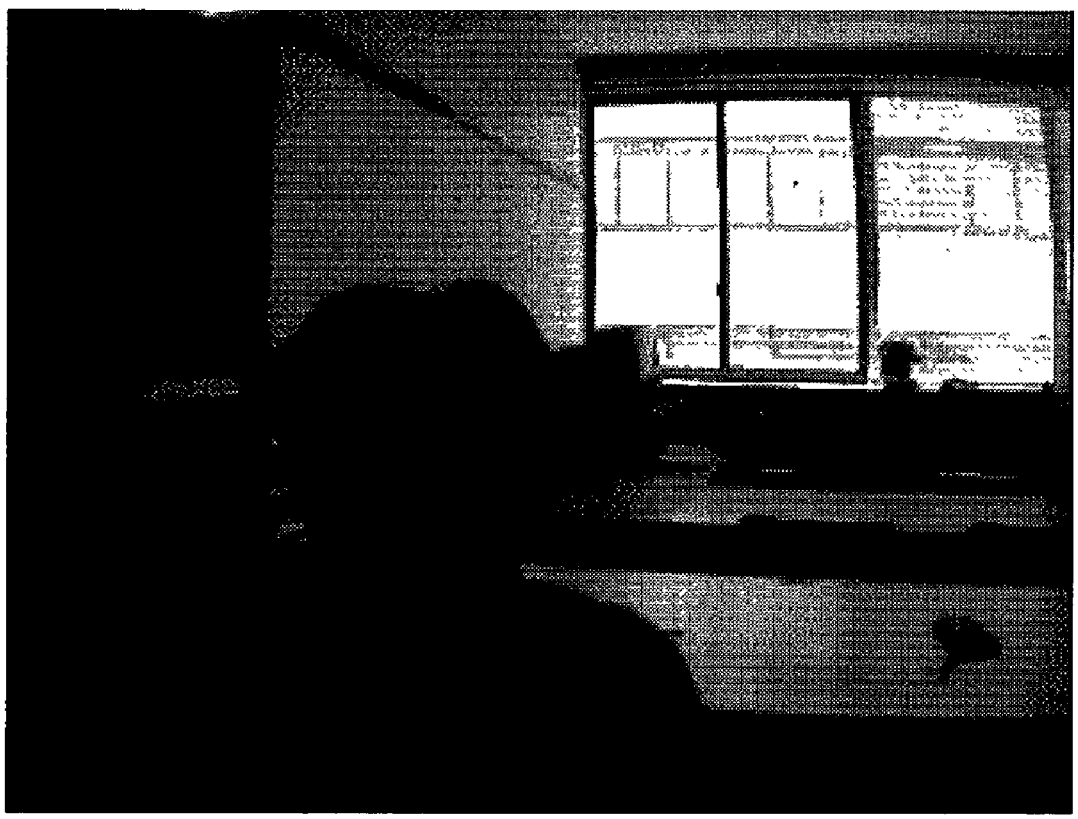
FIG. 15 is a second view showing an example shot by a conventional image pickup device (outside visible)
Figure 16:
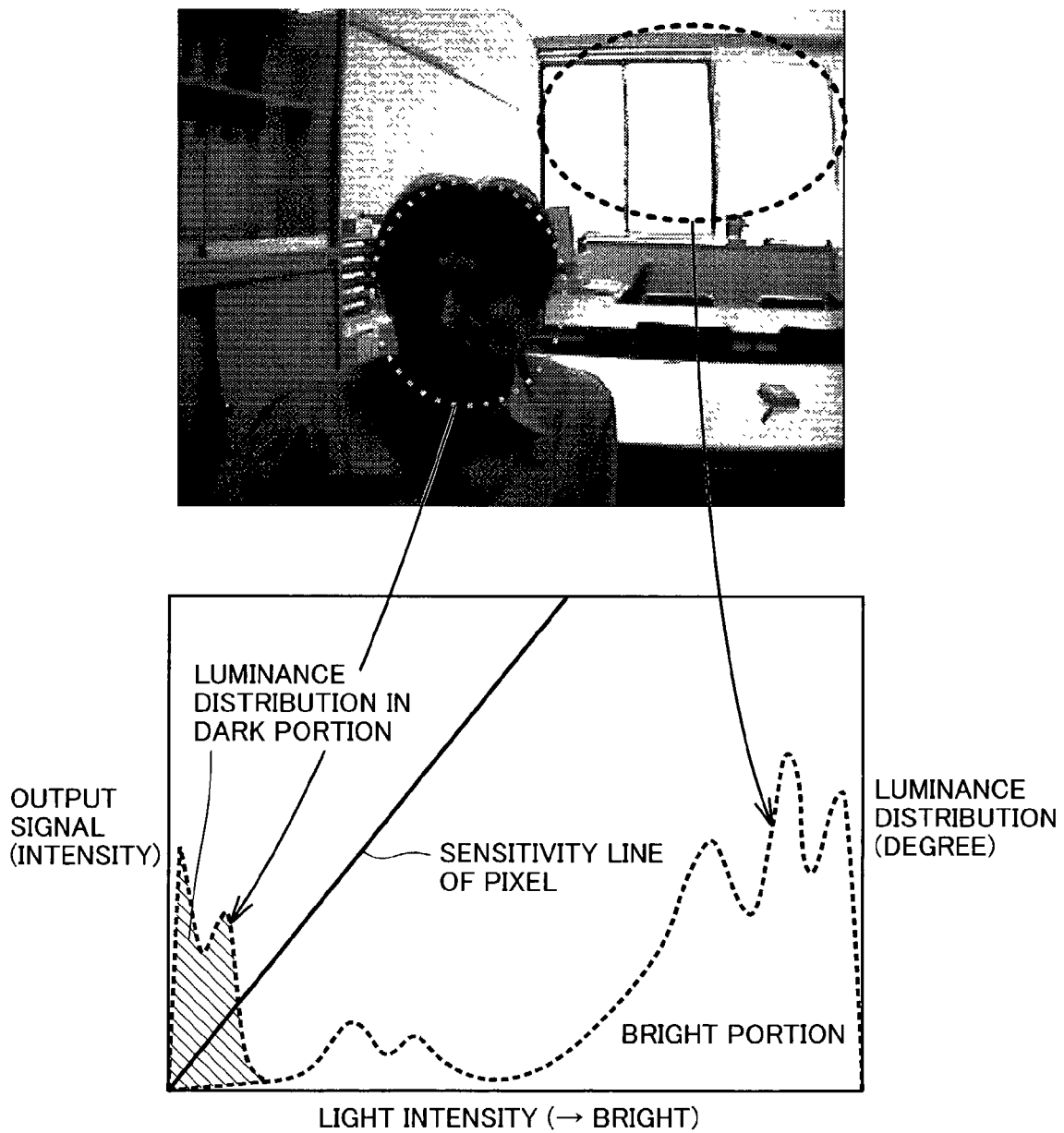
FIG. 16 illustrates low contrast detecting capability of the conventional image pickup device.

FIG. 13 is a circuit diagram showing the configuration of pixels according to the sixth embodiment.

Comparing FIG. 13 with FIG. 11, in the configuration according to the sixth embodiment, resistor R0 is connected between ground voltage GND which is a reset voltage and node Nb, in place of reset transistor Tr0 provided in correspondence to photodiode PD0. The other portions are configured as those in FIG. 11, so that the description thereof will not be repeated.

Such a configuration in which the photodiodes are interchanged in their positions can also detect sufficient contrast in the entire area on the screen with a simplified configuration of reset circuit 5, as in the fourth embodiment. Further, in the circuit configuration shown in FIG. 13, two photodiodes PD0 and PD1 required for each pixel can be arranged, as in the ones shown in FIG. 12, while increase in the area of each pixel and pixel array can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An image pickup device, comprising:
a plurality of pixel circuits forming an image sensor; and
means for adjusting a signal amplification factor inherent to each of said pixel circuits,
wherein each of said pixel circuits includes an MOS transistor that can electrically modulate a gain coefficient by analog modulation and each of said pixel circuits has a control gate for modulating a gain coefficient of said MOS transistor, to which the average of the receiving-light signals on the periphery is input; and
said MOS transistor is used for read amplification of a signal.

2. The image pickup device according to claim 1, wherein each of said pixel circuits modulates a read amplification factor of a detected receiving-light signal inherent to a pixel with an average of detected receiving-light signals in a neighborhood including a peripheral pixel.

3. The image pickup device according to claim 1, wherein said average of the receiving-light signals on the periphery is supplied by a diode formed between a well and a substrate and by a connection resistance between pixels that is set in a form of said well.

4. The image pickup device according to claim 3, further comprising
a photodiode supplying the receiving-light signal of each pixel, formed in said well.

5. An image pickup device, comprising
a plurality of pixels,
each of said pixels including an image signal generating circuit generating an electronic signal according to an amount of light entering into the pixel itself, in accordance with a product of said amount of light and a signal amplification factor, wherein
said signal amplification factor is adjusted based on an amount of light in said pixel itself and an amount of light in at least a part of pixels among other plurality of pixels arranged on a periphery of said pixel itself; and
each of said pixels further includes
a first receiving-light detecting element to generate a first potential according to an amount of light entering into said pixel itself at a first node, and
a second receiving-light detecting element to generate a second potential according to an amount of light entering into said at least a part of pixels at a second node; and
said image signal generating circuit generates said electric signal in accordance with a product of said first and second potentials.

6. The image pickup device according to claim 5, wherein said signal amplification factor is set in accordance with an average amount of light in said at least a part of pixels.

7. The image pickup device according to claim 5, wherein said signal amplification factor in each of said plurality of pixels is set relatively higher at a region in which an average amount of light in said at least a part of pixels is small, compared to a region in which said average amount of light is large.

8. The image pickup device according to claim 5, wherein said first potential is raised as the amount of light entering into said pixel itself increases, and
said second potential is lowered as the amount of light entering into said at least a part of pixels increases.

9. The image pickup device according to claim 5, wherein said first potential is lowered as the amount of light entering into said pixel itself increases, and
said second potential is raised as the amount of light entering into said at least a part of pixels increases.

10. The image pickup device according to claim 5, wherein
said first receiving-light detecting element has a first diode connected between said first node and a first fixed voltage, a direction from said first node toward said first fixed voltage being set as a forward direction,
said second receiving-light detecting element has a second diode connected between said second node and a second fixed voltage, a direction from said second fixed voltage toward said second node being set as a forward direction, and
said second node is electrically coupled with the second node in another pixel of said at least a part of pixels via a resistance component.

11. The image pickup device according to claim 5, wherein
said first receiving-light detecting element has a first diode connected between a first fixed voltage and said first node, a direction from said first fixed voltage toward said first node being set as a forward direction,
said second receiving-light detecting element has a second diode connected between said second node and a second fixed voltage, a direction from said second node to said second fixed voltage being set as a forward direction,
said second node is electrically coupled with the second node in another pixel of said at least a part of pixels via a resistance component.

12. The image pickup device according to claim 5, wherein
said image signal generating circuit includes a field effect transistor that can modulate a gain coefficient by analog modulation in accordance with a voltage applied to a control gate,
said control gate of said field effect transistor is connected with said second node, and
said field effect transistor generates said electric signal by amplifying a potential of said first node based on said gain coefficient.

13. The image pickup device according to claim 5, further comprising a reset circuit to reset potentials of said first and second nodes to prescribed potentials at prescribed cycles, respectively.

14. The image pickup device according to claim 5, further comprising a reset circuit to reset a potential of said first node to a prescribed potential at a prescribed cycle, and to electrically couple said second node to a fixed bias voltage via a resistance component.

15. The image pickup device according to claim 5, wherein
   said image pickup device is formed on a substrate of a first conductivity type,
   said image pickup device further comprises a well region of a second conductivity type opposite to said first conductivity type, formed on said substrate, and
   said second receiving-light detecting element has a diode formed using a junction between said substrate and said well region.

16. The image pickup device according to claim 15, wherein said second node corresponds to said well region.

17. The image pickup device according to claim 15, further comprising:
   a first diffusion region of said first conductivity type formed in said well region; and
   a second diffusion region of said second conductivity type formed in said first diffusion region,
   said first and second diffusion regions being provided independently for each of said pixels,
   said first receiving-light detecting element having a diode formed by using a junction between said first diffusion region and said second diffusion region.

* * * * *